United States Patent
Noguchi et al.

(10) Patent No.: US 10,741,383 B2
(45) Date of Patent: Aug. 11, 2020

(54) SEMICONDUCTOR DEVICE AND METHOD OF MANUFACTURING THE SAME

(71) Applicant: TOSHIBA MEMORY CORPORATION, Minato-ku (JP)

(72) Inventors: Masaki Noguchi, Yokkaichi (JP); Tatsunori Isogai, Yokkaichi (JP); Tomonori Aoyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/123,615

(22) Filed: Sep. 6, 2018

(65) Prior Publication Data

US 2019/0164742 A1 May 30, 2019

(30) Foreign Application Priority Data

Nov. 29, 2017 (JP) .................... 2017-229241

(51) Int. Cl.
*H01L 21/02* (2006.01)
*H01L 27/11582* (2017.01)
*H01L 21/28* (2006.01)

(52) U.S. Cl.
CPC ...... *H01L 21/0214* (2013.01); *H01L 21/0228* (2013.01); *H01L 21/02211* (2013.01); *H01L 27/11582* (2013.01); *H01L 29/40117* (2019.08)

(58) Field of Classification Search
CPC .......... H01L 21/0214; H01L 29/40117; H01L 21/02211; H01L 27/11582; H01L 21/0228
See application file for complete search history.

(56) References Cited

U.S. PATENT DOCUMENTS

| 8,609,551 B2 | 12/2013 | Akae et al. |
| 9,136,114 B2 | 9/2015 | Sasajima et al. |
| 9,437,607 B2 | 9/2016 | Park et al. |

(Continued)

FOREIGN PATENT DOCUMENTS

| JP | 2000-91337 | 3/2000 |
| JP | 2010-50425 | 3/2010 |

(Continued)

OTHER PUBLICATIONS

Hei Wong, et al., "Defects in silicon oxynitride gate dielectric films," Microelectronics Reliability, 42, 2002, 9 pages.

(Continued)

*Primary Examiner* — Su C Kim
(74) *Attorney, Agent, or Firm* — Oblon, McClelland, Maier & Neustadt, L.L.P.

(57) ABSTRACT

In one embodiment, a method of manufacturing a semiconductor device includes alternately forming a plurality of first films and a plurality of second films on a substrate, and forming an opening in the first and second films. The method further includes sequentially forming a first insulator, a charge storage layer, a second insulator and a semiconductor layer on surfaces of the first and second films in the opening. The second insulator includes a silicon oxynitride film, and the silicon oxynitride film is formed using a first gas that includes silicon and a first element, a second gas that includes oxygen and nitrogen, and a third gas that includes a second element that reacts with the first element.

17 Claims, 9 Drawing Sheets

(56) References Cited

U.S. PATENT DOCUMENTS

| | | | |
|---|---|---|---|
| 9,679,662 B1 | 6/2017 | Hashimoto | |
| 2004/0256664 A1* | 12/2004 | Chou | H01L 21/28167 257/324 |
| 2007/0066083 A1 | 3/2007 | Yang et al. | |
| 2015/0263140 A1* | 9/2015 | Yamazaki | H01L 29/78648 438/158 |
| 2016/0284726 A1* | 9/2016 | Sakakibara | H01L 27/11582 |

FOREIGN PATENT DOCUMENTS

| | | |
|---|---|---|
| JP | 2014-57068 | 3/2014 |
| JP | 2017-139036 | 8/2017 |
| JP | 2017-168551 | 9/2017 |
| WO | WO 2012/060379 A1 | 5/2012 |

OTHER PUBLICATIONS

Hongyu Yu, et al., "Investigation of Hole-Tunneling Current Through Ultrathin Oxynitride/Oxide Stack Gate Dielectrics in p-MOSFETs", IEEE Transactions on Electron Devices, vol. 49, No. 7, Jul. 2002, 7 Pages.

Takashi Hori, et al., "Electrical and Physical Properties of Ultrathin Reoxidized Nitrided Oxides Prepared by Rapid Thermal Processing", IEEE Transactions on Electron Devices, vol. 36, No. 2, Feb. 1989, 11 pages.

\* cited by examiner

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2017-229241, filed on Nov. 29, 2017, the entire contents of which are incorporated herein by reference.

FIELD

Embodiments described herein relate to a semiconductor device and a method of manufacturing the same.

BACKGROUND

When a semiconductor device such as a three dimensional semiconductor memory is manufactured, a silicon oxynitride film (SiON) is often formed as an insulator such as a tunnel insulator.

DETAILED DESCRIPTION

Embodiments will now be explained with reference to the accompanying drawings.

In one embodiment, a method of manufacturing a semiconductor device includes alternately forming a plurality of first films and a plurality of second films on a substrate, and forming an opening in the first and second films. The method further includes sequentially forming a first insulator, a charge storage layer, a second insulator and a semiconductor layer on surfaces of the first and second films in the opening. The second insulator includes a silicon oxynitride film, and the silicon oxynitride film is formed using a first gas that includes silicon and a first element, a second gas that includes oxygen and nitrogen, and a third gas that includes a second element that reacts with the first element.

First Embodiment

Figure 1:
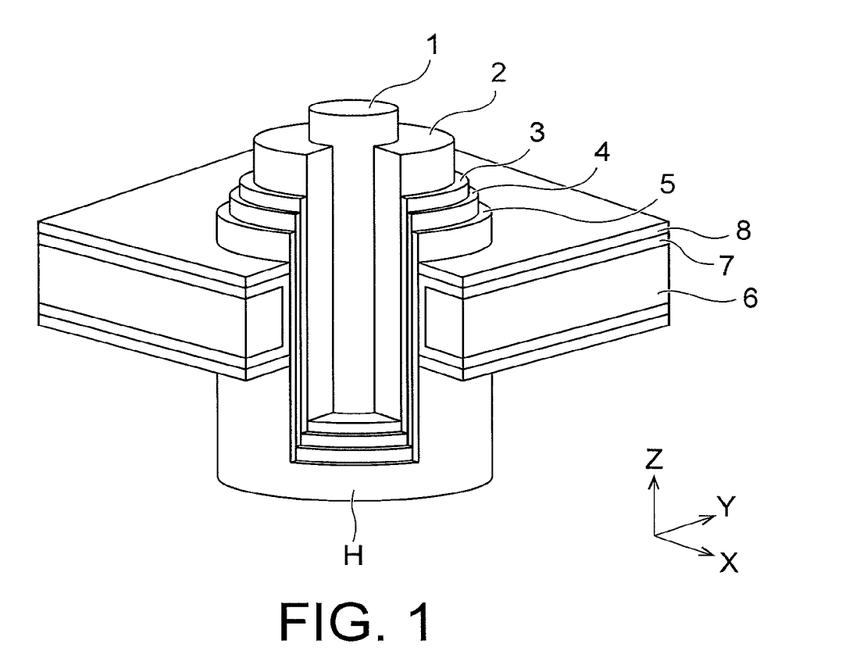
FIG. 1 is a perspective view illustrating a structure of a semiconductor device in a first embodiment.

FIG. 1 is a perspective view illustrating a structure of a semiconductor device in a first embodiment. The semiconductor device in FIG. 1 is a three dimensional flash memory.

The semiconductor device in FIG. 1 includes a core insulator 1, a semiconductor channel layer 2, a tunnel insulator 3, a charge storage layer 4, a block insulator 5, a line material layer 6, a first metal layer 7 and a second metal layer 8. The line material layer 6, the block insulator 5, the tunnel insulator and the semiconductor channel layer 2 are respectively examples of a conductive layer, a first insulator, a second insulator and a semiconductor layer.

In FIG. 1, a plurality of line layers and a plurality of insulators are alternately laminated on a substrate, and a memory hole H is provided in these line layers and the insulators. FIG. 1 illustrates an X direction and a Y direction which are parallel to a surface of the substrate and which are perpendicular to each other, and a Z direction which is perpendicular to the surface of the substrate. In the present specification, +Z direction is handled as an upward direction, and −Z direction is handled as a downward direction. −Z direction may match a gravity direction or may not match the gravity direction. As illustrated in FIG. 1, each line layer is configured with the line material layer 6, the first metal layer 7 and the second metal layer 8. Each line layer functions as a gate electrode (word line), and each insulator functions as an isolation insulator.

The core insulator 1, the semiconductor channel layer 2, the tunnel insulator 3, the charge storage layer 4 and the block insulator 5 are formed in the memory hole H and constitute a memory cell. Specifically, the block insulator 5 is formed on a surface of the line layer and the insulator in the memory hole H, and the charge storage layer 4 is formed on a surface of the block insulator 5. The tunnel insulator 3 is formed on a surface of the charge storage layer 4, and the semiconductor channel layer 2 is formed on a surface of the tunnel insulator 3. The core insulator 1 is formed in the semiconductor channel layer 2.

Examples of the block insulator 5 can include a laminated film including an aluminum oxide film ($Al_2O_3$) and a silicon oxide film ($SiO_2$). Examples of the charge storage layer 4 can include a silicon nitride film (SiN). Examples of the tunnel insulator 3 can include a laminated film including a first silicon oxide film, a silicon oxynitride film (SiON) and a second silicon oxide film. Examples of the semiconductor channel layer 2 can include a silicon layer. Examples of the core insulator 1 can include a silicon oxide film. Examples of the line material layer 6, the first metal layer 7 and the second metal layer 8 can respectively include a tungsten layer (W), a titanium nitride film (TiN) and an aluminum oxide film. In this case, the first metal layer 7 functions as a barrier metal layer, and the second metal layer 8 functions as a block insulator along with the block insulator 5.

Here, a silicon oxynitride film in the tunnel insulator 3 of the present embodiment will be described.

Concentration of nitrogen with respect to silicon, oxygen and nitrogen in the silicon oxynitride film is equal to or higher than 15 at % and equal to or lower than 30 at %. Further, the silicon oxynitride film contains hydrogen (H), and concentration of hydrogen in the silicon oxynitride film is equal to or lower than $2\times10^{21}$ [atoms/cm$^3$]. Still further, the number of N—H bonds in the silicon oxynitride film is equal to or smaller than $2\times10^{21}$ [bonds/cm$^3$], and the number of Si—H bonds in the silicon oxynitride film is equal to or smaller than $5\times10^{20}$ [bonds/cm$^3$]. A thickness of the silicon oxynitride film is set at, for example, equal to or less than 5 nm. Details of these conditions will be described later.

The semiconductor device of the present embodiment performs write operation by injecting electrons into the charge storage layer 4 from the channel semiconductor layer 2 via the tunnel insulator 3 and performs deletion operation by injecting holes into the charge storage layer 4 from the channel semiconductor layer 2 via the tunnel insulator 3 to neutralize electronically. To perform write operation and deletion operation at a low voltage, changing a material forming the tunnel insulator 3 to a material with a small bandgap or narrowing a bandgap of the silicon oxynitride film in the tunnel insulator 3 is effective. Here, if the concentration of nitrogen in the silicon oxynitride film is increased, because a barrier height on the hole side with respect to silicon is largely reduced, it is possible to substantially reduce an operating voltage for deletion.

However, if the concentration of nitrogen in the silicon oxynitride film increases, a structure of the silicon oxynitride film changes to a structure in which electrons and holes are easily trapped. In this case, there occur problems that charge retention characteristics degrade by leakage of charges in the charge storage layer 4 to the tunnel insulator 3, and that reliability is impaired by degradation of insulating performance of the tunnel insulator 3 itself. For example, there occurs a problem that reliability of cell operation is impaired such as erroneous writing to a cell adjacent to a desired cell upon writing or reading. Therefore, the concentration of nitrogen in the silicon oxynitride film of the present embodiment is set from 15 to 30 at % as described above. By this means, it is possible to suppress trapping of charges in the silicon oxynitride film while a bandgap of the silicon oxynitride film is narrowed.

It is known that the number of N—H bonds in the silicon oxynitride film increases in accordance with increase in concentration of nitrogen. It is considered that bonding energy of the N—H bond is low, the N—H bond is dissociated by thermal load, or the like, in a later process, and —N* formed by dissociation becomes a trap site which captures charges. When a three dimensional flash memory is manufactured, because it is necessary to form a good tunnel insulator 3 in the memory hole H having a high aspect ratio, it is desirable to form a silicon oxynitride film using an ALD (Atomic Layer Deposition) method. However, in the case where a silicon oxynitride film is formed using the ALD method, because cyclic flow is often performed in order of a Si source gas, an oxidizing agent and a nitriding agent, or in order of a Si source gas, a nitriding agent and an oxidizing agent, it is considered that an O—O bond or an N—N bond whose bonding energy is low scarcely exists in the silicon oxynitride film. Further, in the case where ammonia (NH$_3$) is used as a nitriding agent, —Si*, —N*, or the like, are hydrogen-terminated, and a Si—H bond and an N—H bond are formed. As mentioned above, it is considered that these become trap sites which capture both electrons and holes when hydrogen is dissociated. That is, in other words, it is considered that the number of charges trapped in the silicon oxynitride film increases in accordance with increase in concentration of hydrogen in the silicon oxynitride film.

Therefore, the silicon oxynitride film of the present embodiment is formed using, for example, the ALD method, and a method which can reduce the concentration of hydrogen in the silicon oxynitride film is employed. By this means, while the silicon oxynitride film of the present embodiment contains hydrogen, it is possible to reduce the concentration of hydrogen in the silicon oxynitride film to equal to or lower than $2\times10^{21}$ [atoms/cm$^3$]. Further, the number of N—H bonds in the silicon oxynitride film can be made equal to or less than $2\times10^{21}$ [bonds/cm$^3$], and the number of Si—H bonds in the silicon oxynitride film can be made equal to or less than $5\times10^{20}$ [bonds/cm$^3$].

The tunnel insulator 3 of the present embodiment is a laminated film including the first silicon oxide film, the silicon oxynitride film and the second silicon oxide film, and a thickness of the silicon oxynitride film is set at, for example, equal to or less than 5 nm. With such a thickness, it is possible to make this laminated film function as the tunnel insulator 3.

Figure 2A:
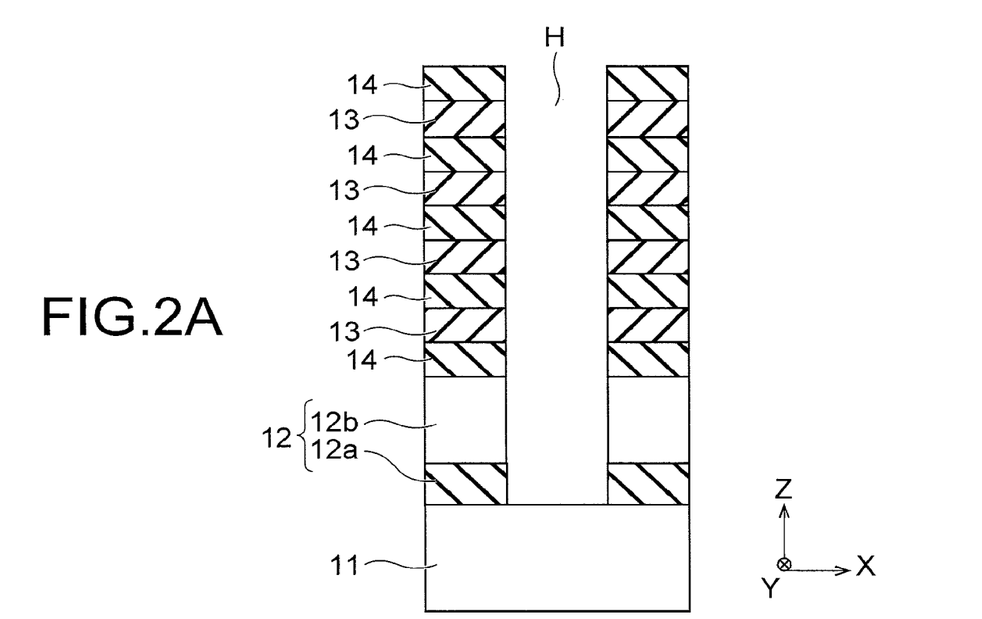
FIGS. 2A and 2B are cross-section views illustrating a method of manufacturing the semiconductor device in the first embodiment.
Figure 2B:
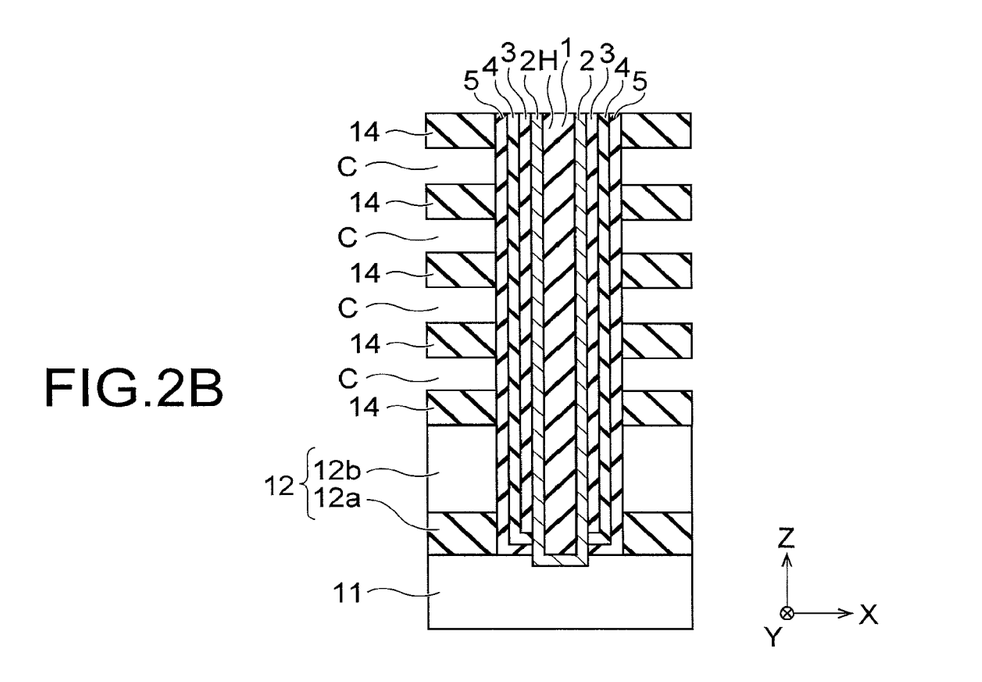

FIGS. 2A and 2B are cross-section views illustrating the method of manufacturing the semiconductor device in the first embodiment.

First, a foundation layer 12 is formed on a substrate 11, and a plurality of first films 13 and a plurality of second films 14 are alternately formed on the foundation layer 12 (FIG. 2A). Next, a memory hole H which pierces through the foundation layer 12, the first films 13 and the second films 14 is formed (FIG. 2A). The memory hole H is an example of an opening.

Examples of the substrate 11 can include a semiconductor substrate such as a silicon substrate. Examples of the foundation layer 12 can include a laminated film including an inter layer dielectric 12a on the substrate 11 and a semiconductor layer 12b on the inter layer dielectric 12a. Examples of the inter layer dielectric 12a can include a silicon oxide film and a silicon nitride film. Examples of the semiconductor layer 12b can include a polysilicon layer. The memory hole H of the present embodiment is formed so as to pierce through the inter layer dielectric 12a and the semiconductor layer 12b. Examples of the first film 13 can include a silicon nitride film. Examples of the second film 14 can include a silicon oxide film.

The second film 14 is an insulator described with reference to FIG. 1. The first film 13 is a sacrifice layer for forming a line layer described with reference to FIG. 1. In the present embodiment, as will be described later, a plurality of cavities is formed between the second films 14 by removing the first film 13, and the second metal layer 8, the first metal layer 7 and the line material layer 6 are sequentially formed in these cavities. As a result, a plurality of line layers is formed in these cavities. This is called a replace process. In the case where the replace process is not employed, a line layer such as a tungsten layer may be formed as the first film 13 in the process in FIG. 2A.

Then, on surfaces of the foundation layer 12, the first film 13 and the second film 14 in the memory hole H, the block insulator 5, the charge storage layer 4, the tunnel insulator 3 and the semiconductor channel layer 2 are sequentially formed, and the remaining memory hole H is embedded with the core insulator 1 (FIG. 2B). Then, a trench which is not illustrated is formed in the first film 13 and the second film 14, and the first film 13 is removed with chemicals such as phosphoric acid by utilizing this trench. As a result, a plurality of cavities C is formed between the second films 14 (FIG. 2B).

Specifically, the block insulator 5, the charge storage layer 4, the tunnel insulator 3, the semiconductor channel layer 2 and the core insulator 1 are formed as follows. First, the block insulator 5, the charge storage layer 4 and the tunnel insulator 3 are sequentially formed on a surface of the foundation layer 12, the first film 13 and the second film 14 in the memory hole H. Then, the block insulator 5, the charge storage layer 4 and the tunnel insulator 3 are removed from a bottom of the memory hole H through etching. By this means, the substrate 11 is exposed in the memory hole H. Then, the semiconductor channel layer 2 and the core insulator 1 are sequentially formed in the memory hole H.

The semiconductor channel layer 2 is, for example, a polysilicon layer. To reduce surface roughness of the semiconductor channel layer 2, an amorphous silicon layer for forming the semiconductor channel layer 2 may be formed at a low temperature of approximately 500° C., and the amorphous silicon layer may be subjected to heat treatment at a temperature equal to or higher than 800° C. By this means, the amorphous silicon layer is crystallized, and a polysilicon layer with little surface roughness is formed.

Subsequently, the second metal layer 8, the first metal layer 7 and the line material layer 6 are sequentially formed in the cavities C (see FIG. 1). As a result, a plurality of line layers is formed in the cavities C. The line material layer 6 is formed using, for example, a CVD (Chemical Vapor Deposition) method or the ALD method. In this manner, the semiconductor device in FIG. 1 is manufactured.

While the first film 13 and the second film 14 of the present embodiment are laminated such that the second film 14 is first formed on the foundation layer 12, for example, in the case where other types of three dimensional flash memories are employed, the films may be laminated such that the first film 13 is first formed on the foundation layer 12. In this case, a configuration of the foundation layer 12 may be made a configuration different from that in the present method. Further, in the case where the first film 13 and the second film 14 are directly formed on the substrate 11, the foundation layer 12 is not required.

Figure 3:
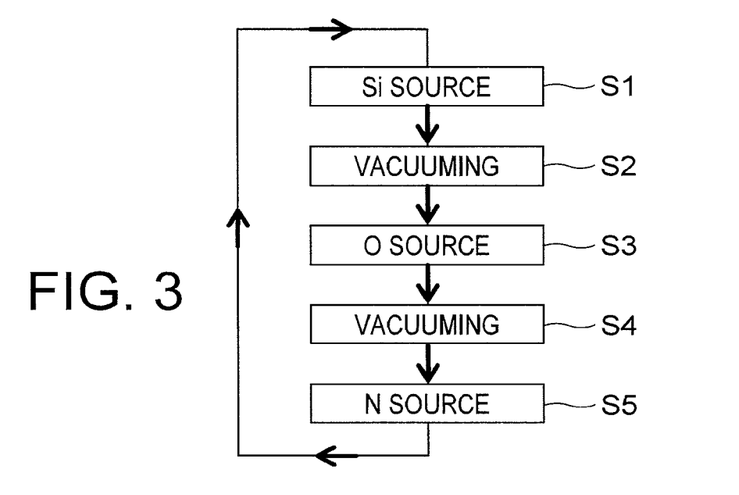
FIG. 3 is a flowchart illustrating a method of manufacturing a semiconductor device in a first comparative example.
Figure 4:
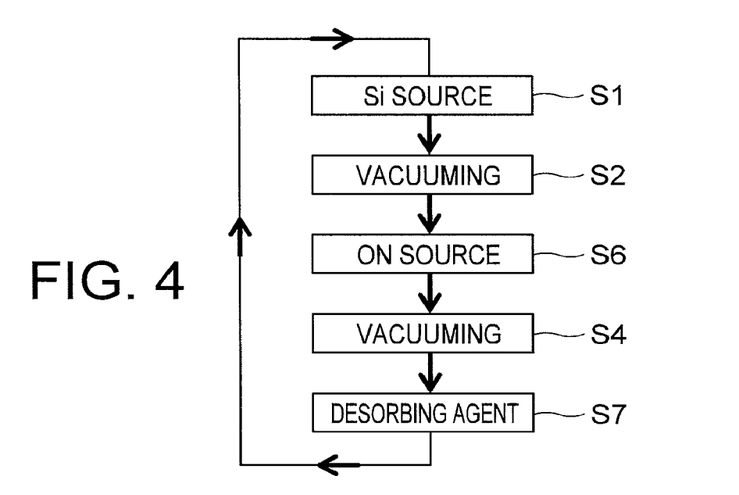
FIG. 4 is a flowchart illustrating the method of manufacturing the semiconductor device in the first embodiment.

FIG. 3 is a flowchart illustrating a method of manufacturing a semiconductor device in a first comparative example which is a comparative example of the first embodiment. FIG. 4 is a flowchart illustrating the method of manufacturing the semiconductor device of the first embodiment.

FIG. 4 illustrates a method for forming a silicon oxynitride film in the tunnel insulator 3 in the present embodiment. Meanwhile, FIG. 3 illustrates a method for forming a silicon oxynitride film using a method different from that in the present embodiment. Hereinafter, these silicon oxynitride films will be expressed as SiON films.

In the first comparative example, as processing of one cycle, steps S1, S2, S3, S4 and S5 are sequentially performed. By the processing being repeated for a plurality of cycles, an SiON film is formed.

Specifically, the substrate 11 is held in an ALD apparatus, and, first, a Si source gas is supplied to the substrate 11 (step S1). Then, after vacuuming and $N_2$ purge of the ALD apparatus are performed, an O source gas (oxidizing agent) is supplied to the substrate 11 (steps S2 and S3). Then, after vacuuming and $N_2$ purge of the ALD apparatus are performed, an N source gas (nitriding agent) is supplied to the substrate 11 (steps S4 and S5). In the first comparative example, by this processing being repeated for a plurality of cycles, an SiON film is formed on the substrate 11.

On the other hand, in the present embodiment, as processing of one cycle, steps S1, S2, S6, S4 and S7 are sequentially performed. By this processing being repeated for a plurality of cycles, an SiON film is formed.

Specifically, the substrate 11 is held in the ALD apparatus, and, first, a Si source gas is supplied to the substrate 11 (step S1). Then, after vacuuming and $N_2$ purge of the ALD apparatus are performed, an ON source gas (oxynitriding agent) is supplied to the substrate 11 (steps S2 and S6). Then, after vacuuming and $N_2$ purge of the ALD apparatus are performed, a desorbing agent for a Si source gas is supplied to the substrate 11 (steps S4 and S7). The desorbing agent is used for causing reaction with impurities in the Si source gas and desorbing the impurities. In the present embodiment, by this processing being repeated for a plurality of cycles, an SiON film is formed on the substrate 11. The Si source gas, the ON source gas and the desorbing agent are respectively examples of a first gas, a second gas and a third gas.

Details of the method in the first embodiment will be described below.

The Si source gas is a gas including silicon and at least one type of a first element. Examples of the Si source gas can include HCD (hexachlorodisilane: $Si_2Cl_6$), DCS (dichlorosilane: $SiH_2Cl_2$), TCS (tetrachlorosilane: $SiCl_4$), TrisCS (trichlorosilane: $SiHCl_3$), OCTS (octachlorotrisilane: $Si_3Cl_8$), or the like. The Si source gas in the present embodiment is HCD, and the first element in this case is chlorine (Cl).

The ON source gas is a gas including oxygen and nitrogen. Examples of the ON source gas can include $NO_x$ (nitrogen oxide) such as NO (nitric oxide), $NO_2$ (nitrogen dioxide) and $N_2O$ (nitrous oxide). The ON source gas in the present embodiment is $N_2O$.

The desorbing agent is a gas including a second element which reacts with the first element. In the case where the first element is chlorine, examples of the desorbing agent can include $H_2$ (hydrogen) and $NH_3$ (ammonia). The second element in this case is hydrogen (H). The hydrogen may be light hydrogen "$^1H$" or deuterium "$^2H$ (=D)". Hereinafter, $^1H$ will be expressed as "H", and $^2H$ will be expressed as "D". Examples of the desorbing agent can include, $H_2$, $D_2$, $NH_3$, $ND_3$, or the like. The desorbing agent in the present embodiment is $NH_3$, and H in the desorbing agent reacts with Cl in the Si source gas (oxidation-reduction reaction).

Examples of the ALD apparatus can include a low-pressure batch vertical film forming furnace. In the present embodiment, the number of cycles of the above-described processing is adjusted so that the SiON film has a desired thickness. While loop processing in FIG. 4 is started from step S1, the loop processing may be started from other steps if the SiON film can be formed. According to the method of the present embodiment, it is possible to form an SiON film whose concentration of nitrogen is from 15 to 30 at %.

The SiON film of the present embodiment is, for example, formed at a temperature from 600 to 800° C. and under pressure of sawing conditions. While flow time of each gas may be set at any value, the flow time is preferably set at a value which enables formation of an SiON film having a uniform thickness. For example, a flow rate and a gas pressure of $N_2O$ are respectively adjusted from 0.5 to 9.5 slm and from 5 to 40 Pa, and a flow rate and a gas pressure of $NH_3$ are respectively adjusted from 0.25 to 1.5 slm and 1 to 10 Pa. The flow rates of these gases can be controlled by a mass flow controller.

The first embodiment and the first comparative example will be compared below.

Figure 5:
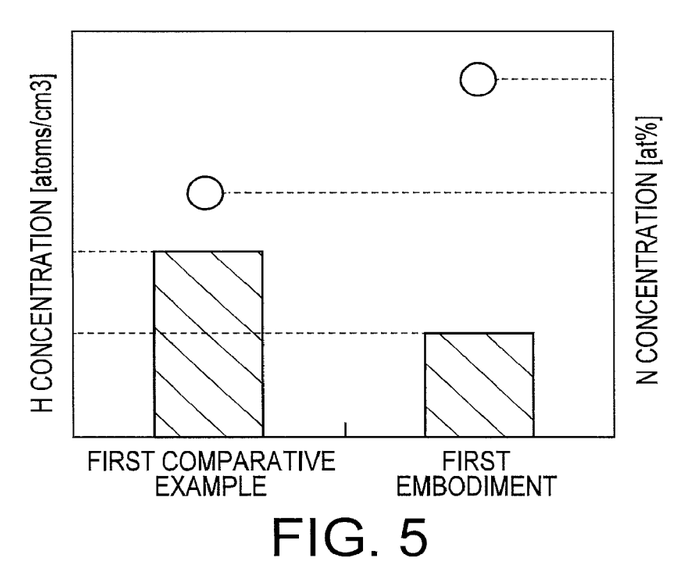
FIG. 5 is a graph for comparing the first embodiment and the first comparative example.

FIG. 5 is a graph for comparing the first embodiment and the first comparative example.

FIG. 5 illustrates measurement results of concentration of nitrogen and concentration of hydrogen in the SiON film in the present embodiment, and concentration of nitrogen and concentration of hydrogen in the SiON film in the present comparative example. It can be seen that, according to the present embodiment, the concentration of nitrogen in the SiON film increases compared to the present comparative example, and the concentration of hydrogen in the SiON film decreases compared to the present comparative example.

The Si source gas, the O source gas and the N source gas in the present comparative example are, for example, respectively, HCD ($Si_2Cl_6$), $O_2$ and $NH_3$. In this case, if a flow rate of $NH_3$ is made higher, hydrogen becomes more likely to be mixed into the SiON film. However, if the flow rate of $NH_3$ is made lower, concentration of nitrogen in the SiON film becomes less likely to be increased.

On the other hand, the Si source gas, the ON source gas and the desorbing agent in the present embodiment are respectively HCD ($Si_2Cl_6$), $N_2O$ and $NH_3$. In this case, it is possible to increase the concentration of nitrogen in the SiON film with $N_2O$. Further, because nitrogen in the SiON film can be supplied from $N_2O$, it is possible to increase the concentration of nitrogen in the SiON film without increasing a flow rate of $NH_3$. Therefore, it is possible to suppress the flow rate of $NH_3$ at low, and suppress the concentration of hydrogen in the SiON film at low. The flow rate of $NH_3$ in the present embodiment can be made a lower value sufficient to desorb chlorine.

According to the present embodiment, as illustrated in FIG. 5, it is possible to realize both increase in the concentration of nitrogen and reduction in the concentration of hydrogen.

Figure 6:
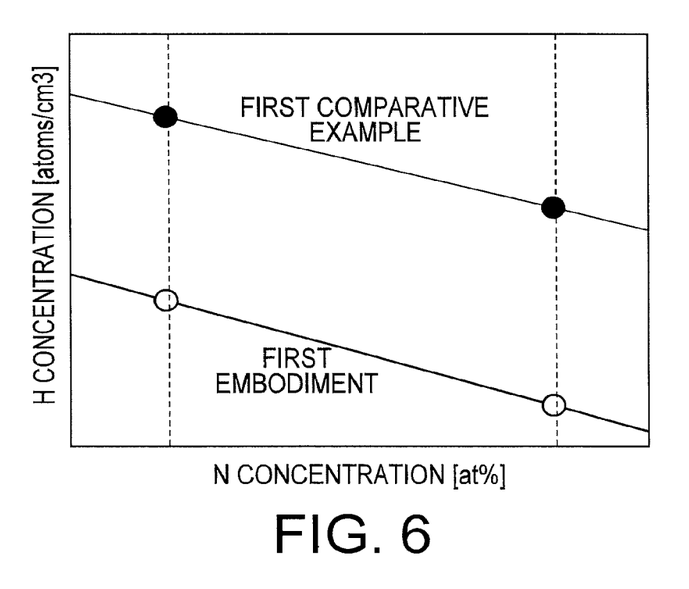
FIG. 6 is another graph for comparing the first embodiment and the first comparative example.

FIG. 6 is another graph for comparing the first embodiment and the first comparative example.

FIG. 6 illustrates measurement results of concentration of hydrogen in the present embodiment and concentration of hydrogen in the present comparative example regarding two types of concentration of nitrogen. In this manner, according to the present embodiment, it is possible to increase concentration of nitrogen while concentration of hydrogen is reduced.

As described above, the SiON film in the present embodiment is formed using the Si source gas including silicon and the first element, the ON source gas including oxygen and nitrogen, and the desorbing agent including the second element which reacts with the first element. Therefore, according to the present embodiment, it is possible to realize a preferred silicon oxynitride film whose concentration of nitrogen is high, whose concentration of hydrogen is low, or the like.

The method of the present embodiment can be also applied to a two-dimensional flash memory. In this case, layers constituting the memory cell are formed with the tunnel insulator 3, the charge storage layer 4 and the block insulator 5 in this order on the substrate 1. In this case, the tunnel insulator 3 is an example of the first insulator, the block insulator 5 is an example of the second insulator, and the first insulator includes an SiON film.

A semiconductor device and a method of manufacturing the same according to a second to ninth embodiments will be described below with reference to FIGS. 1 to 2B. In these embodiments, an SiON film is formed using flow different from that in FIG. 4. In description of these embodiments, description of matters in common with the first embodiment will be omitted as appropriate.

Second Embodiment

Figure 7:
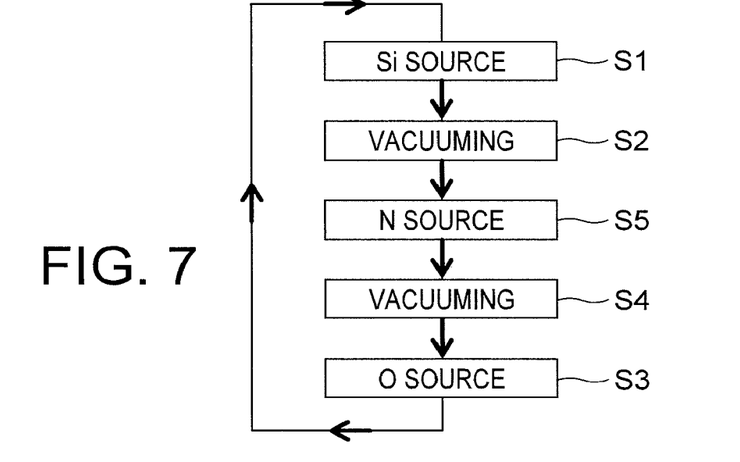
FIG. 7 is a flowchart illustrating a method of manufacturing a semiconductor device in a second comparative example.
Figure 8:
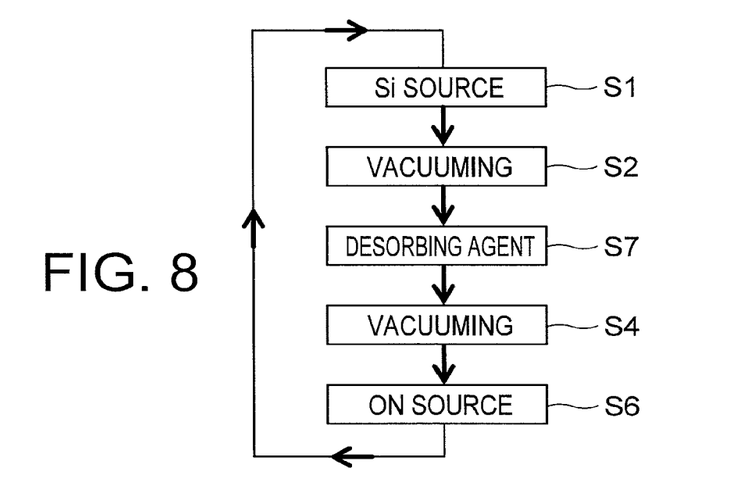
FIG. 8 is a flowchart illustrating a method of manufacturing a semiconductor device in a second embodiment.

FIG. 7 is a flowchart illustrating a method of manufacturing a semiconductor device in a second comparative example which is a comparative example of the second embodiment. FIG. 8 is a flowchart illustrating the method of manufacturing the semiconductor device in the second embodiment.

In FIG. 7, order of step S3 and step S5 is inverse with respect to that in FIG. 3, and the O source gas is supplied after the N source gas is supplied. In a similar manner, in FIG. 8, order of step S6 and step S7 is inverse with respect to that in FIG. 4, and the ON source gas is supplied after the desorbing agent is supplied.

Details of the method in the second embodiment will be described below.

The Si source gas, the desorbing agent and the ON source gas in the present embodiment are respectively HCD, $NH_3$ and $N_2O$. In the present embodiment, because $N_2O$ is supplied after $NH_3$ is supplied, it is possible to make concentration of hydrogen in the SiON film lower than that in the first embodiment. On the other hand, in the first embodiment, because $NH_3$ is supplied after $N_2O$ is supplied, it is possible to improve surface flatness of the SiON film. While loop processing in FIG. 8 is started from step S1, the loop processing may be started from other steps if the SiON film can be formed. The same applies to the third to ninth embodiments which will be described later.

Third Embodiment

Figure 9:
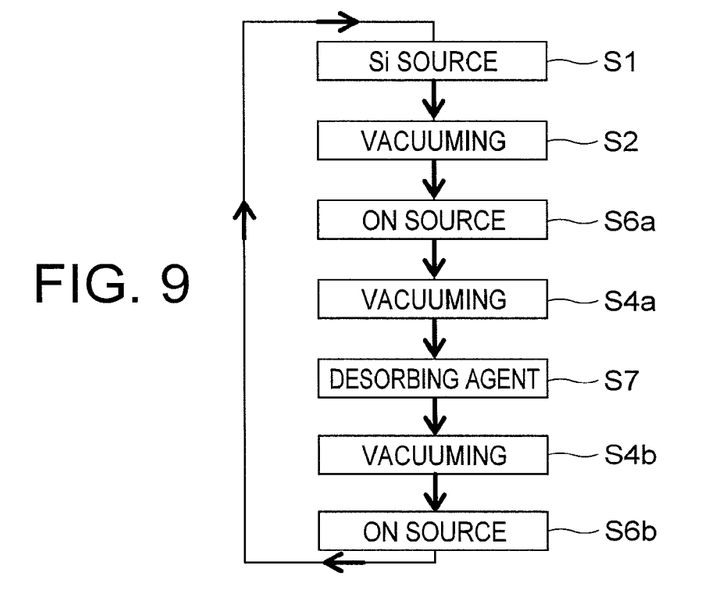
FIG. 9 is a flowchart illustrating a method of manufacturing a semiconductor device in a third embodiment.

FIG. 9 is a flowchart illustrating the method of manufacturing the semiconductor device in the third embodiment.

In FIG. 9, step S6 in FIG. 4 is replaced with step S6*a* in which the ON source gas is supplied before the desorbing agent is supplied in each cycle and step S6*b* in which the ON source gas is supplied after the desorbing agent is supplied in each cycle. The former ON source gas and the latter ON source gas may be the same type of gas, or may be different types of gas. In the present embodiment, both the former ON source gas and the latter ON source gas are $N_2O$. These ON source gases are examples of a second gas and a fourth gas.

In FIG. 9, further, step S4 in FIG. 4 is replaced with step S4*a* and step S4*b*. In step S4*a*, vacuuming and $N_2$ purge of the ALD apparatus are performed between flow of the former ON source gas and flow of the desorbing agent. In step S4*b*, vacuuming and $N_2$ purge of the ALD apparatus are performed between flow of the desorbing agent and flow of the latter ON source gas.

In the present embodiment, as processing of one cycle, steps S1, S2, S6*a*, S4*a*, S7, S4*b* and S6*b* are sequentially performed. By this processing being repeated for a plurality of cycles, an SiON film is formed.

In the present embodiment, a flow rate of the ON source gas in step S6*a* is adjusted to be 5 slm, and a flow rate of the ON source gas in step S6*b* is adjusted to be 0.25 slm. That is, the flow rate in step S6*a* is adjusted to be higher than the flow rate in step S6*b*. By this means, for example, it is possible to increase concentration of nitrogen in the SiON film through step S6*a*, and finely adjust concentration of nitrogen in the SiON film through step S6*b*. Inversely, the flow rate in step S6*a* may be adjusted to be lower than the flow rate in step S6*b*. The flow rates of these gases can be controlled by a mass flow controller.

As described above, the SiON film of the present embodiment is formed using step S6*a* in which the ON source gas is supplied before the desorbing agent is supplied and step S6*b* in which the ON source gas is supplied after the desorbing agent is supplied. Therefore, according to the present embodiment, it is possible to realize a preferred silicon oxynitride film by, for example, adjusting the concentration of nitrogen to be high concentration with high accuracy.

Fourth to Ninth Embodiments

Figure 10:
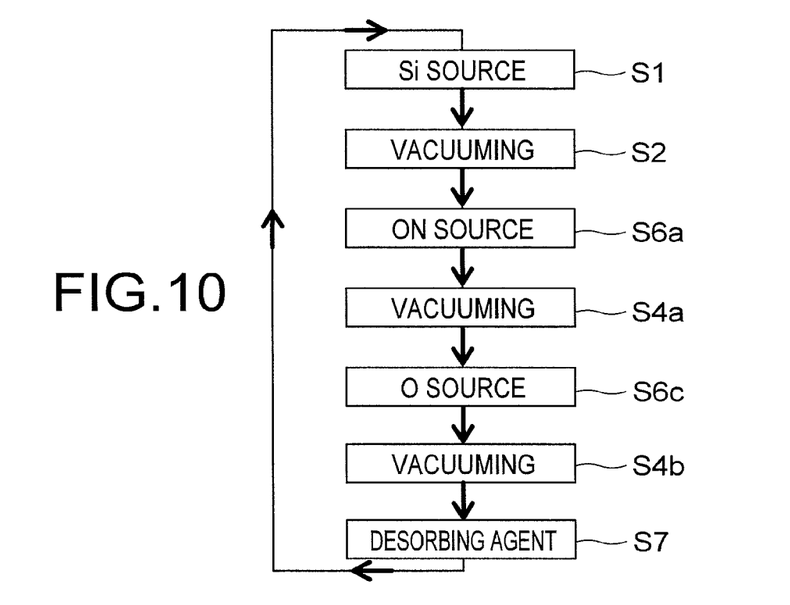
FIG. 10 is a flowchart illustrating a method of manufacturing a semiconductor device in a fourth embodiment.

FIG. 10 is a flowchart illustrating the method of manufacturing the semiconductor device in the fourth embodiment.

In FIG. 10, step S6b in FIG. 9 is replaced with step S6c in which the O source gas is supplied. In this manner, in the present embodiment, the ON source gas and the O source gas are supplied in each cycle instead of the ON source gas being supplied twice in each cycle. Examples of the O source gas can include $O_2$ (oxygen). The O source gas is an example of a fifth gas.

In the present embodiment, as processing of one cycle, steps S1, S2, S6a, S4a, S6c, S4c and S7 are sequentially performed. By this processing being repeated for a plurality of cycles, the SiON film is formed.

The Si source gas, the ON source gas, the O source gas and the desorbing agent in the present embodiment are respectively HCD, $N_2O$, $O_2$ and $NH_3$. For example, a flow rate and a gas pressure of $N_2O$ are respectively adjusted to be from 0.5 to 9.5 slm and from 5 to 40 Pa, a flow rate and a gas pressure of $O_2$ are respectively adjusted to be from 0.25 to 10 shin and from 5 to 50 Pa, and a flow rate and a gas pressure of $NH_3$ are respectively adjusted to be from 0.25 to 1.5 slm and from 1 to 10 Pa. The flow rates of these gases can be controlled by a mass flow controller.

According to the present embodiment, it is possible to roughly adjust the concentration of nitrogen and the concentration of oxygen in the SiON film using, for example the ON source gas. Further, according to the present embodiment, it is possible to finely adjust the concentration of oxygen in the SiON film using, for example, the O source gas, so that it is possible to finely adjust the concentration of nitrogen in the SiON film. The reason is that, because the concentration of nitrogen in the present embodiment is concentration of nitrogen with respect to silicon, oxygen and nitrogen in the SiON film, if the concentration of oxygen changes, the concentration of nitrogen also changes.

Figure 11:
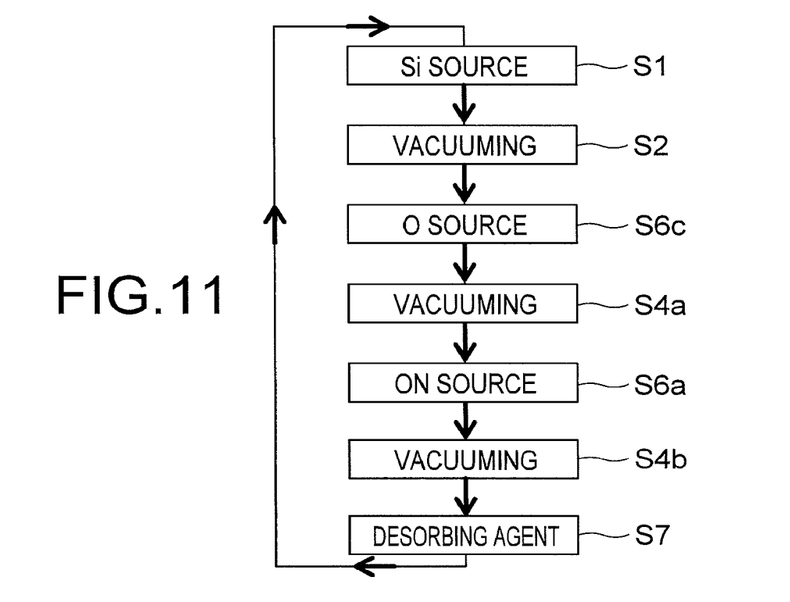
FIG. 11 is a flowchart illustrating a method of manufacturing a semiconductor device in a fifth embodiment.

FIG. 11 is a flowchart illustrating the method of manufacturing the semiconductor device in the fifth embodiment.

In FIG. 11, order of step S6a and step S6c is inverse with respect to that in FIG. 10, and the ON source gas is supplied after the O source gas is supplied. By this means, the SiON film can be formed in a similar manner to the flow in FIG. 10.

Figure 12:
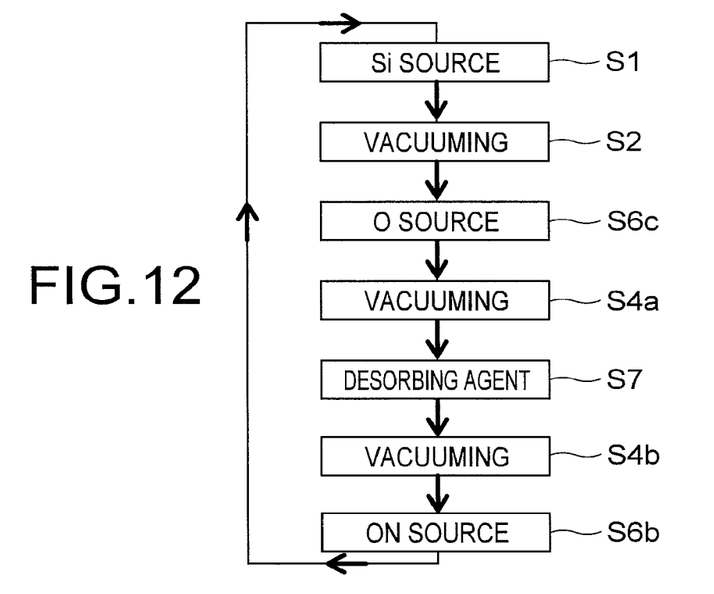
FIG. 12 is a flowchart illustrating a method of manufacturing a semiconductor device in a sixth embodiment.

FIG. 12 is a flowchart illustrating the method of manufacturing the semiconductor device in the sixth embodiment. In the present embodiment, as processing of one cycle, steps S1, S2, S6c, S4a, S7, S4b and S6b are sequentially performed.

Figure 13:
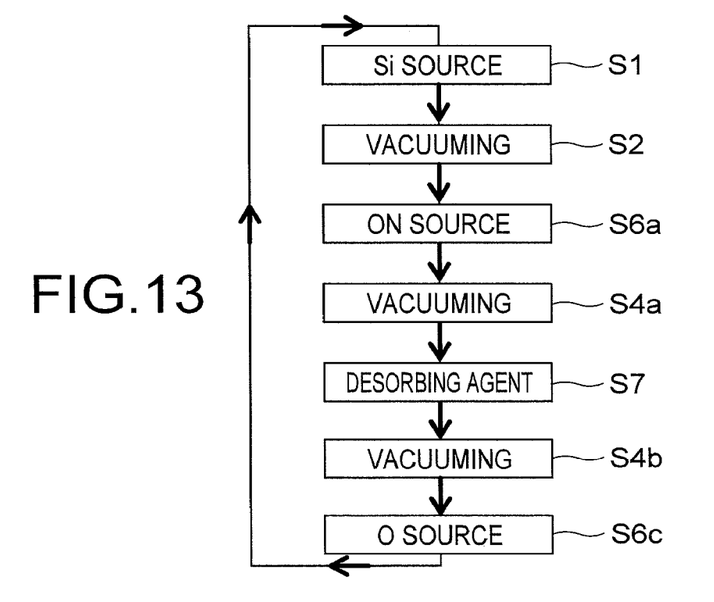
FIG. 13 is a flowchart illustrating a method of manufacturing a semiconductor device in a seventh embodiment.

FIG. 13 is a flowchart illustrating the method of manufacturing the semiconductor device in the seventh embodiment. In FIG. 13, order of step S6a and step S6c is inverse with respect to that in FIG. 12.

Figure 14:
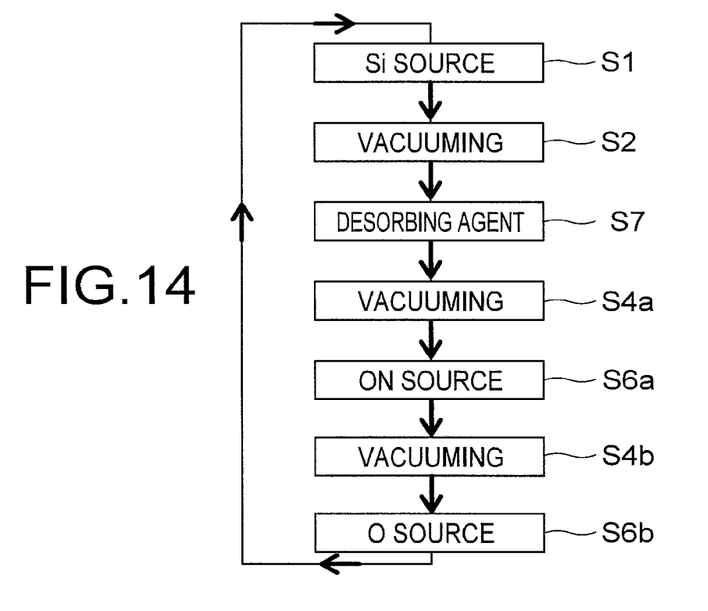
FIG. 14 is a flowchart illustrating a method of manufacturing a semiconductor device in an eighth embodiment.

FIG. 14 is a flowchart illustrating the method of manufacturing the semiconductor device in the eighth embodiment. In the present embodiment, as processing of one cycle, steps S1, S2, S7, S4a, S6a, S4b and S6b are sequentially performed.

Figure 15:
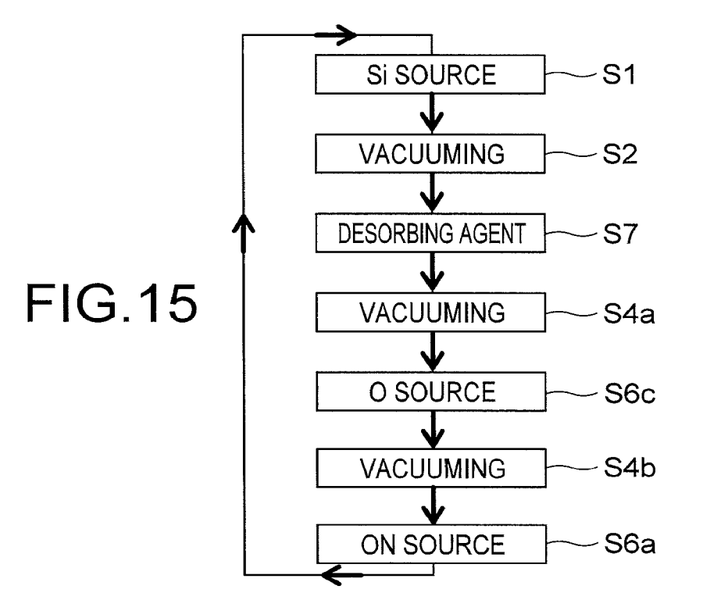
FIG. 15 is a flowchart illustrating a method of manufacturing a semiconductor device in a ninth embodiment.

FIG. 15 is a flowchart illustrating the method of manufacturing the semiconductor device in the ninth embodiment. In FIG. 15, order of step S6a and step S6c is inverse with respect to that in FIG. 14.

As described above, the SiON film in these embodiments is formed through step S6a in which the ON source gas is supplied, and step S6c in which the O source gas is supplied. Therefore, according to the present embodiment, it is possible to realize a preferred silicon oxynitride film by, for example, adjusting the concentration of nitrogen to be high concentration with high accuracy.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
    alternately forming a plurality of first films and a plurality of second films on a substrate;
    forming an opening in the first and second films; and
    sequentially forming a first insulator, a charge storage layer, a second insulator and a semiconductor layer on surfaces of the first and second films in the opening, wherein
    the second insulator includes a silicon oxynitride film, and
    the silicon oxynitride film is formed using a first gas that includes silicon and a first element, a second gas that includes oxygen and nitrogen, and a third gas that includes a second element that reacts with the first element.

2. The method of claim 1, wherein concentration of nitrogen with respect to silicon, oxygen and nitrogen in the silicon oxynitride film is equal to or higher than 15 at % and equal to or lower than 30 at %.

3. The method of claim 1, wherein the silicon oxynitride film contains hydrogen, and concentration of hydrogen in the silicon oxynitride film is equal to or lower than $2\times10^{21}$ [atoms/cm$^3$].

4. The method of claim 1, wherein the number of N—H bonds in the silicon oxynitride film is equal to or less than $2\times10^{21}$ [bonds/cm$^3$], and the number of Si—H bonds in the silicon oxynitride film is equal to or less than $5\times10^{20}$ [bonds/cm$^3$], where N, H and Si respectively indicate nitrogen, hydrogen and silicon.

5. The method of claim 1, wherein the first element is chlorine, and the second element is hydrogen.

6. The method of claim 5, wherein the second element is hydrogen that corresponds to light hydrogen or deuterium.

7. The method of claim 1, wherein the second insulator is formed by processing of supplying the first gas, the second gas and the third gas being repeated for a plurality of cycles.

8. The method of claim 1, wherein the second insulator is formed by further using a fourth gas that includes oxygen and nitrogen.

9. The method of claim 8, wherein the second insulator is formed by processing of supplying the first gas, the second gas, the third gas and the fourth gas being repeated for a plurality of cycles.

10. The method of claim 9, wherein, in each cycle, one of the second gas and the fourth gas is supplied before the third gas is supplied, and the other of the second gas and the fourth gas is supplied after the third gas is supplied.

11. The method of claim 10, wherein, in each cycle, one of the second gas and the fourth gas is supplied at a first flow rate before the third gas is supplied, and the other of the second gas and the fourth gas is supplied at a second flow rate which is lower than the first flow rate after the third gas is supplied.

12. The method of claim 1, wherein the second insulator is formed by further using a fifth gas that includes oxygen.

13. The method of claim 12, wherein the second insulator is formed by processing of supplying the first gas, the second gas, the third gas and the fifth gas being repeated for a plurality of cycles.

14. A method of manufacturing a semiconductor device, comprising:
 forming a first insulator;
 forming a charge storage layer on a surface of the first insulator; and
 forming a second insulator on a surface of the charge storage layer, wherein
 the first or the second insulator includes a silicon oxynitride film, and
 the silicon oxynitride film is formed using a first gas that includes silicon and a first element, a second gas that includes oxygen and nitrogen, and a third gas that includes a second element which reacts with the first element.

15. The method of claim 14, wherein concentration of nitrogen with respect to silicon, oxygen and nitrogen in the silicon oxynitride film is equal to or higher than 15 at % and equal to or lower than 30 at %.

16. The method of claim 14, wherein the silicon oxynitride film contains hydrogen, and concentration of hydrogen in the silicon oxynitride film is equal to or lower than $2 \times 10^{21}$ [atoms/cm$^3$].

17. The method of claim 14, wherein the first element is chlorine, and the second element is hydrogen.

* * * * *